US007554346B2

(12) United States Patent
Kluth et al.

(10) Patent No.: US 7,554,346 B2
(45) Date of Patent: Jun. 30, 2009

(54) TEST EQUIPMENT FOR AUTOMATED QUALITY CONTROL OF THIN FILM SOLAR MODULES

(75) Inventors: Oliver Kluth, Walenstadt (CH); Jiri Springer, Sevelen (CH); Michael Mohr, Salez (CH); Andreas Hugli, Seewis (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 0 days.

(21) Appl. No.: 12/105,331

(22) Filed: Apr. 18, 2008

(65) Prior Publication Data

US 2008/0258747 A1 Oct. 23, 2008

Related U.S. Application Data

(60) Provisional application No. 60/943,694, filed on Jun. 13, 2007, provisional application No. 60/912,799, filed on Apr. 19, 2007.

(51) Int. Cl.
*G01R 31/302* (2006.01)

(52) U.S. Cl. .................. 324/750; 324/752; 250/200

(58) Field of Classification Search ............ None
See application file for complete search history.

(56) References Cited

U.S. PATENT DOCUMENTS 3,630,627 A * 12/1971 Low et al. ............... 356/222
4,712,063 A * 12/1987 Osterwald et al. ........ 324/766
7,309,850 B2 * 12/2007 Sinton et al. ............. 250/203.4
7,411,408 B2 * 8/2008 Shimotomai et al. ...... 324/752
2003/0122558 A1 * 7/2003 Hacke ..................... 324/693

FOREIGN PATENT DOCUMENTS

| JP | 59020870 A | 2/1984 |
| JP | 2004241449 A | 8/2004 |
| WO | 0126163 A1 | 4/2001 |

OTHER PUBLICATIONS

International Search Report dated Oct. 2, 2008.
Written Opinion dated Oct. 15, 2008.

* cited by examiner

*Primary Examiner*—Minh N Tang
(74) *Attorney, Agent, or Firm*—Pearne & Gordon LLP

(57) ABSTRACT

Provided is a method and test system for identifying a defective region of a photovoltaic cell from among a plurality of photovoltaic cells collectively forming a thin film solar module. A probe includes a plurality of test fingers arranged to be substantially simultaneously placed adjacent to an electric contact provided to different regions of one or more of the plurality of photovoltaic cells, and each of the test fingers is to receive an electrical output from the different regions of the one or more photovoltaic cells. A light source emits light to be converted by the photovoltaic cells into the electrical output during testing. A measurement circuit measures a property of the electrical output received from the different regions of the photovoltaic cells and transmits a measured value signal indicative of the property measured by the measurement circuit. And a control unit receives the measured value signal and generates a visible display indicating that at least one of the different regions of the solar module is a defective region based at least in part on the measured value signal, and also indicates a location of the defective region on the solar module.

22 Claims, 4 Drawing Sheets

TEST EQUIPMENT FOR AUTOMATED QUALITY CONTROL OF THIN FILM SOLAR MODULES

BACKGROUND OF THE INVENTION

1. Field of the Invention

The present invention is directed generally toward the testing of thin film solar modules to detect malfunctions and, more specifically, toward a method and apparatus for testing a plurality of individual photovoltaic cells electrically coupled together in series to localize any of the individually tested photovoltaic cells that are not performing as desired.

2. Description of Related Art

Traditionally, photovoltaic ("PV") cells referred to as crystalline silicon PV cells included a substrate formed from crystalline silicon to act as the light-absorbing semiconductor. Light energy from the sun is absorbed within the silicon and converted into electric energy. Single-crystal silicon wafers sliced from an ingot of single-crystal silicon are most often used because they offer favorable conversion efficiencies, and thus produce a desirable output of electrical energy.

But crystalline silicon PV cells have significant drawbacks, the most notable of which include cost, size and durability. The single-crystal silicon ingot is produced by a lengthy, costly and heat-and-pressure-sensitive process. Moreover, single-crystal silicon is also the semi-conducting material from most conventional microprocessors are formed. This creates a significant demand for a limited supply of wafers formed from single-crystal silicon, and in turn, high costs associated with such wafers.

The process of producing single-crystal silicon wafers also limits the maximum diameter of the wafers on which individual PV cells are to be formed. Typically, a single-crystal silicon ingot is drawn from a hot silicon melt. Single-crystal silicon grows from a center axis of the ingot radially outward to produce an ever increasing diameter. However, the longer the single-crystal silicon is permitted to grow the more likely it is that imperfections will be introduced into the silicon crystal lattice from conditions such as temperature and/or pressure fluctuations, the speed at which the ingot is drawn from the melt, impurities in the melt. Thus, to create an array of PV cells large enough to produce the desired output of electric energy many single crystal silicon wafers will be needed. Due to the cost considerations mentioned above this will often make crystalline silicon PV cells economically impractical for commercial applications.

Further, crystalline silicon PV cells are typically fragile and sensitive to environmental conditions such as moisture. This requires sealing the PV cells of an array within a rugged enclosure, adding additional costs to such arrays of crystalline PV cells.

Considering these drawbacks, advances in PV cell technology have been focused on thin film PV cells. Unlike the crystalline PV cells, thin film PV cells include a light-absorbing semiconductor formed from materials with less stringent processing requirements such as amorphous silicon, or other polycrystalline materials. Further, thin film PV cells can be on the order of one micron (i.e., one-millionth of a meter) thick, requiring less of the light-absorbing material than their crystalline counterparts. Thin film PV cells can be realized on flexible substrates and have a high durability. And because a single-crystal semiconductor material is not required, the light-absorbing semiconductor of thin film PV cells is conducive to large area deposition techniques. Thin film PV cells can form arrays on large substrates having surface areas of 1 m² to more than 4 m².

Although thin film PV cells include more cost effective and readily-available materials, they do not produce as much electric energy as crystalline silicon PV cells, on average. Because of the lower average output of individual thin film PV cells compared to crystalline silicon PV cells, the arrays of thin film PV cells are larger, including many more individual thin film PV cells than crystalline silicon PV cells required to produce a comparable output voltage. When such an array of thin film PV cells does not perform as expected it is often the result of an imperfection in one or more of the individual thin film PV cells. But due to the large number of such cells in the array, however, locating the offending cells is a daunting and time-consuming task.

Accordingly, there is a need in the art for a method and apparatus for testing thin film PV cells collectively forming a thin-film solar module. The method and apparatus can identify thin film PV cells within the module that are not generating a desired output and identify a location of those thin film PV cells within the module.

BRIEF SUMMARY OF THE INVENTION

According to one aspect, the present invention provides a test system for identifying a defective region of a photovoltaic cell from among a plurality of photovoltaic cells collectively forming a thin film solar module. The test system includes a probe comprising a plurality of test fingers that are arranged to each be substantially simultaneously placed adjacent to an electric contact provided to different regions of one or more of the plurality of photovoltaic cells. Each of the test fingers is to receive an electrical output from the different regions of the one or more photovoltaic cells. The test system further includes a light source that emits light to be converted by the photovoltaic cells into the electrical output during testing, and a measurement circuit that measures a property of the electrical output received from the different regions of the photovoltaic cells and transmits a measured value signal indicative of the property measured by the measurement circuit. A control unit is operatively coupled to the measurement circuit for receiving the measured value signal and generating a visible display indicating that at least one of the different regions of the solar module is a defective region based at least in part on the measured value signal and indicating a location of the defective region on the solar module.

According to another aspect, the present invention provides a method of testing a thin film solar module comprising a plurality of adjacent photovoltaic cells distributed along a first dimension of the solar module and extending along a second dimension of the solar module, wherein an electrical output is to be tested for variations along the second dimension of the solar module. The method includes illuminating at least one photovoltaic cell of the solar module, receiving an electrical output of the at least one photovoltaic cell at a first position along the second dimension of the solar module, and receiving an electrical output of the at least one photovoltaic cell at a second position along the second dimension of the solar module, wherein the second position is different than the first position. The method further includes performing a comparison of the electrical output from the photovoltaic cell at the first and second positions along the second dimension to predetermined values to determine if the electrical output from the photovoltaic cell at the first and second positions is at least equal to the predetermined values, and determining that at least one of the first and second positions of the photovoltaic cell along the second dimension of the solar module is a defective region of the solar module if the electrical output from the photovoltaic cell at the at least one of the first and second positions does not at least equal the predetermined values. the location of such a defective region is also indicated relative to another region of the solar module.

According to yet another embodiment, the present invention provides a test system for identifying a malfunctioning portion of a solar module. The test system includes a probe comprising a plurality of test fingers each arranged to communicate with a different one of a plurality of adjacent photovoltaic cells arranged along a first dimension of the solar module for receiving an electrical output from each of the plurality of photovoltaic cells. The plurality of test fingers are arranged to extend substantially entirely across the solar module in the first dimension during testing. The test system further includes a light source that emits light to be converted by the photovoltaic cells into the electrical output during testing, and a driver that adjusts a position of at least one of the probe and the solar module to position the probe at a plurality of test locations along a second dimension of the solar module. A measurement circuit evaluates the electrical output from the plurality of photovoltaic cells introduced to the test fingers during testing and generates a value representing a contribution of each of the photovoltaic cells tested to an overall output of the solar module.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION OF ILLUSTRATIVE EMBODIMENTS

Figure 1:
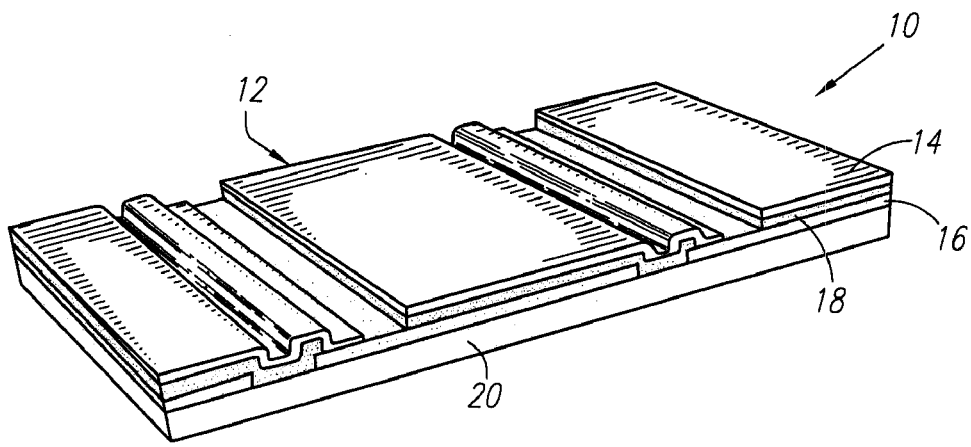
FIG. 1 is a partial perspective view of a thin film solar module comprising a plurality of photovoltaic cells electrically connected in series.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

A solar module 10 including a plurality of thin-film photovoltaic cells 12 interconnected in series is shown in FIG. 1. By connecting the photovoltaic cells 12 in series the open-circuit voltage (Voc) of each photovoltaic cell 12 is added together in a cumulative fashion. A suitable number of the photovoltaic cells 12 can be provided to the solar module 10 to produce a suitable open-circuit voltage depending on the particular application, but such solar modules 10 typically include approximately 80-300 photovoltaic cells 12/m in the width direction W of the solar module 10.

Each thin-film photovoltaic cell 12 in FIG. 1 includes an exposed electrical contact 14 formed from a layer of any suitable transparent conductive oxide, such as a layer of substantially-transparent indium tin oxide ("ITO") or zinc oxide (ZnO), for example. A layer of amorphous silicon 16 or other suitable light-absorbing material separates the exposed contact 14 from an inward contact 18. The various layers of the photovoltaic cells 12 are supported on a substantially-transparent substrate 20 made of glass or other suitable insulator.

Figure 2:
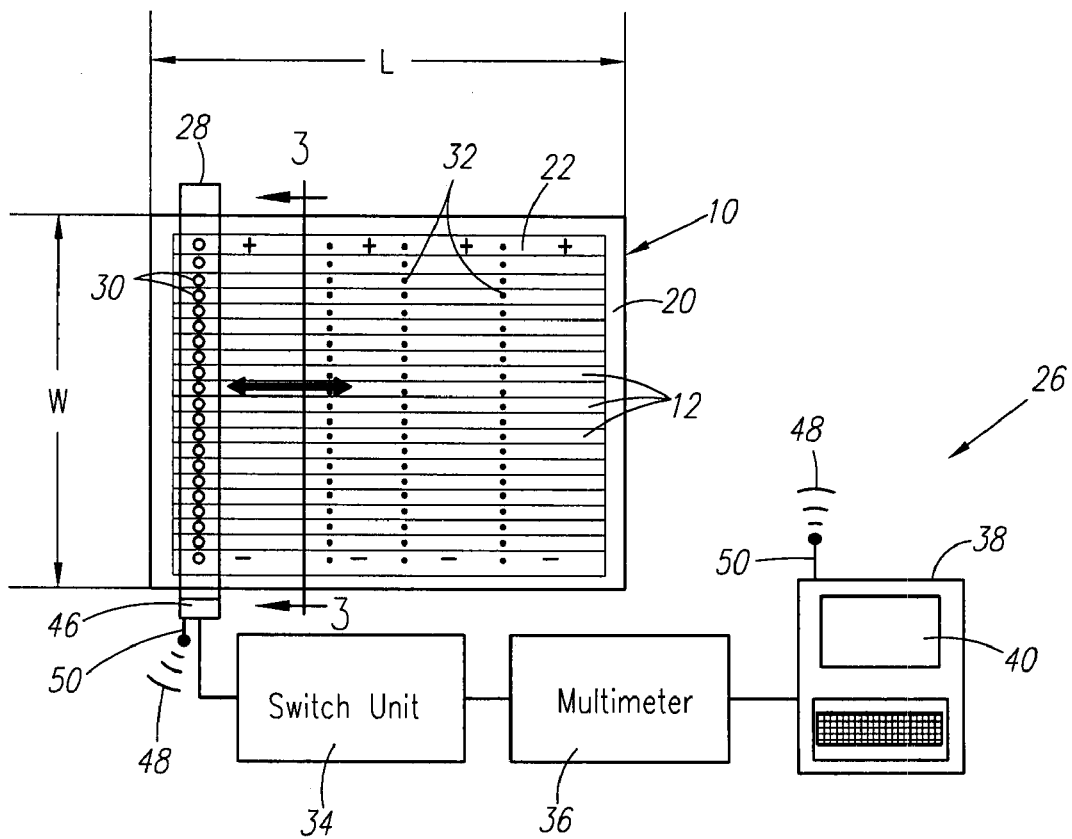
FIG. 2 is a schematic representation of a test system for identifying a malfunctioning portion of a thin-film solar module according to an aspect of the present invention.

As depicted more clearly in FIG. 2, a plurality (typically 80-300 cells/m) of the thin-film photovoltaic cells 12 are interconnected in series, and arranged substantially parallel to each other on the substrate 20. So arranged, the photovoltaic cells 12 are distributed along a width dimension W of the solar module 10, arranged in close proximity with their elongated edges facing each other to exhibit the "stacked" configuration in the width dimension W in FIG. 2. Likewise, the photovoltaic cells each 12 extend along a length dimension L of the solar module 10, and typically extends almost the entire length L of the solar module to opposing terminal ends of the solar module 10. With the photovoltaic cells 12 connected in series so their respective open-circuit voltages (Voc) are added together, one outermost photovoltaic cell acts as the positive cell 22 at which the cumulative open-circuit voltage (Voc) of all the photovoltaic cells 12 is present. Similarly, the opposite outermost photovoltaic cell acts as the reference cell 24, at which a reference voltage (Vr), possibly ground, for example, is present.

The solar module 10 shown in FIG. 2 includes photovoltaic cells 12 distributed along almost the entire width dimension W and extending along a substantial extent of the length dimension L to support the maximum number of photovoltaic cells 12 on the substrate 20. However, other solar modules 10 can include photovoltaic cells 12 distributed or extending along only one dimension (length L or width W).

Figure 4:
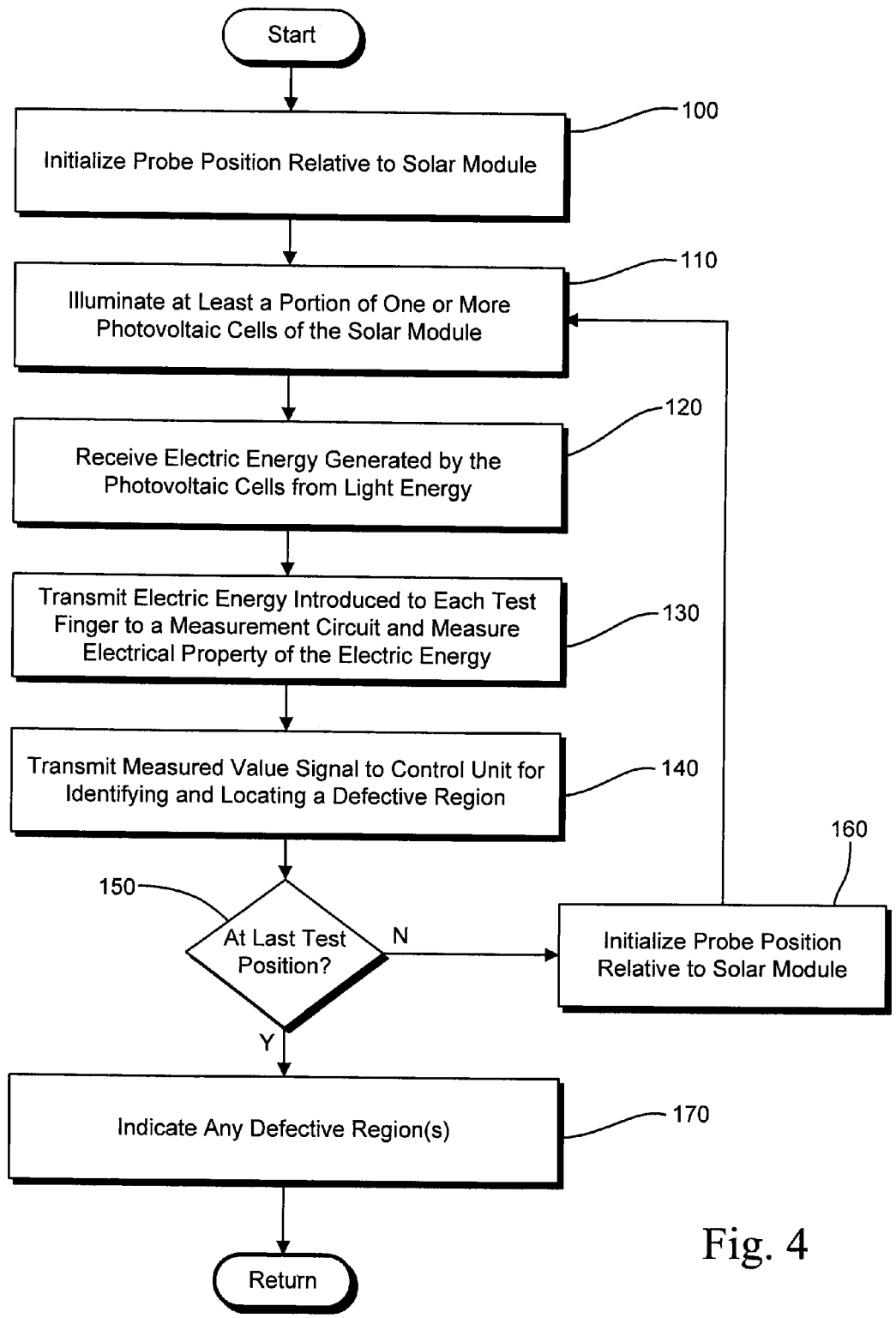
FIG. 4 is a flow diagram illustrating a test method according to an aspect of the present invention.

Local defects on the photovoltaic cells 12 or on the patterning lines interconnecting the photovoltaic cells 12 can lead to shunts or other imperfections in the solar module 10 that strongly affect the electrical quality of individual photovoltaic cells 12, and hence the overall open-circuit voltage (Voc) of the solar module 10. As shown in FIG. 4 and discussed in greater detail below, the dip in open-circuit voltage (Voc) at about position 9 on one of the photovoltaic cells 12 under test is the result of such a local defect. Further, the open-circuit voltage (Voc) of each of the photovoltaic cells 12 can vary along the length dimension L of the substrate 20, depending on the position of such local defects in the photovoltaic cells 12, making location and isolation of the defects difficult.

A test system 26 according to an embodiment of the present invention for locating such local defects that have an impact on the electrical properties of the solar module 10 is also shown in FIG. 2. The test system 26 can identify one or more defective regions of the photovoltaic cells 12 that collectively form the thin-film solar module 10. As shown, the test system includes a probe 28 for communicating with the photovoltaic cells 12. An electrical output signal emitted by the photovoltaic cells 12 is introduced to the test system 26 through the probe 28. The electrical output signal emitted by the photovoltaic cells 12 and introduced to the probe 28 includes an electrical quantity that is to be evaluated by the test system 26 to determine whether the portions of the photovoltaic cells 12 under test are functioning as desired. Examples of the electrical property that can be evaluated for purposes of evaluating the operation of the portions of the photovoltaic cells 12 include the open-circuit voltage (Voc) at various different regions of the photovoltaic cells 12, the electric current produced at a plurality of different regions of the photovoltaic cells 12, and any other suitable electrical property that can be evaluated to indicate the possible presence of a defect in the tested regions of the photovoltaic cells 12.

Figure 3:
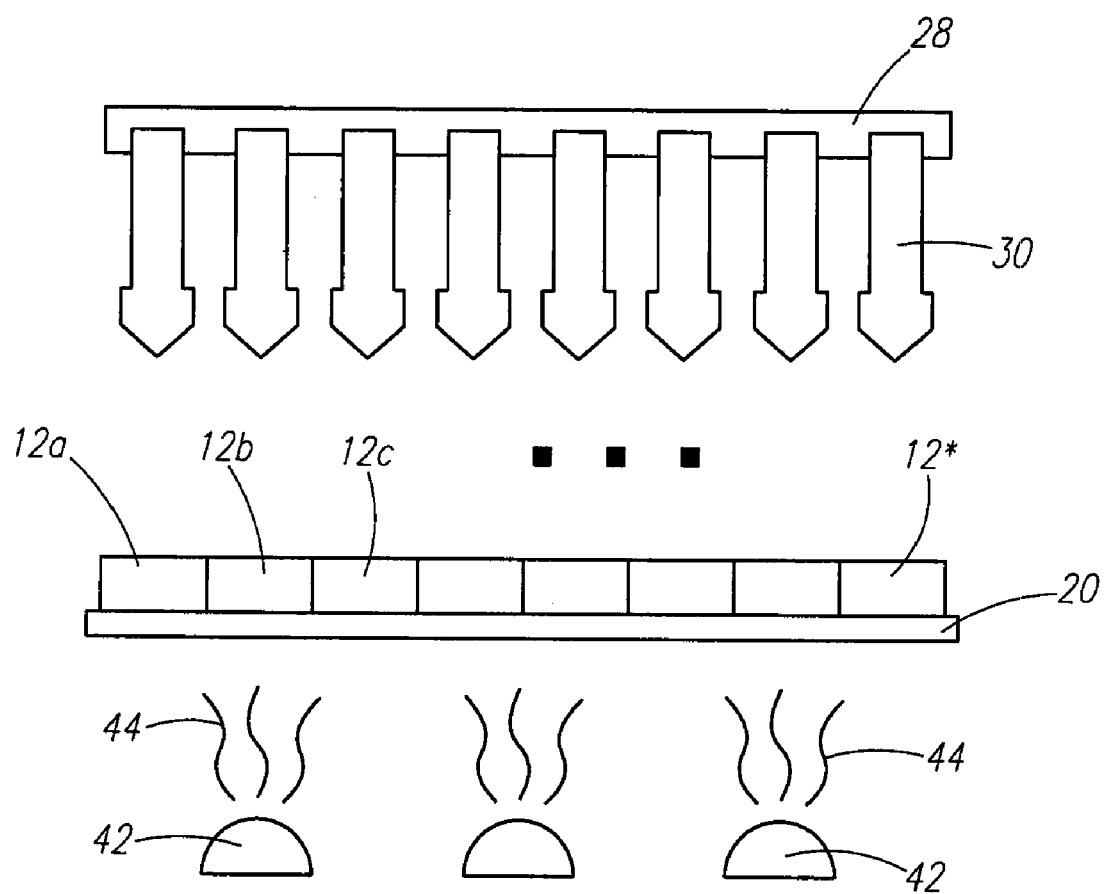
FIG. 3 is a partial cross-sectional view of an arrangement of a probe, a light source and a thin film solar module under test taken along line 3-3 in FIG. 2 according to an aspect of the present invention.

Shown in FIGS. 2 and 3, the probe 28 includes a plurality of test fingers 30 that extend outwardly, away from the probe 28 to make contact with one or a plurality of electric contacts provided to the regions of the photovoltaic cells 12 to be tested. The test fingers 30 can be any suitable electrical contact, such as spring contacts, and are arranged to each substantially simultaneously make contact with, or at least placed adjacent to the exposed electric contacts 14 provided to the plurality of photovoltaic cells 12. Arranged in this manner, the probe 28 supporting the fingers 30 extends over a substantial portion of at least one dimension of the collection of photovoltaic cells 12 forming the solar module 10. In FIGS. 2 and 3 the probe 28, and accordingly the test fingers 30, are distributed in the width W dimension over a substantially portion, and according to some embodiments, the entire collection of photovoltaic cells 12 forming the solar module 10. For such embodiments, the test fingers 30 can be substantially simultaneously brought into electrical communication with a region of the exposed contact 14 provided to all of the photovoltaic cells 12. Substantially simultaneously establishing communication in this manner minimizes the length of time required to introduce the electrical output signal from each region of the photovoltaic cells 12 to the probe 28 to be evaluated as described below.

The test fingers 30 are arranged to extend substantially entirely across the collection of photovoltaic cells 12 forming the solar module 10 in a first dimension (i.e., the width dimension W for the embodiment shown in FIG. 2) of the solar module 10 under test. The thin films forming the photovoltaic cells 12 extend longitudinally along the second dimension (i.e., the length dimension L of the embodiment of FIG. 2) of the solar module 10, wherein the second dimension is approximately perpendicular to the first dimension. Thus, a suitable number of test fingers 30 is provided to the probe 28, and the test fingers 30 are arranged to communicate with each of the photovoltaic cells 12 distributed along the width dimension W of the solar module 10 under test. The probe 28 and test fingers 30 can be relocated to a plurality of different positions 32 along the thin film photovoltaic cells 12 in the length dimension L of the solar module 10. Alternately, the solar module 10 can be relocated to establish the desired relative position of the fingers 30 to the various positions on the exposed contact 14 of the thin film photovoltaic cells 12 along the length dimension L. Yet other embodiments include adjusting both the position of the test fingers 30 and the position of the solar module 10.

Receiving the electrical output signal via the test fingers 30 at the plurality of different positions 32 along the length dimension L, with a suitable number and arrangement of test fingers 30 to extend substantially across the entire width dimension W allows the test system 26 to effectively evaluate operation of the solar module 10 over at least a representative portion of the solar module's surface in a single pass, without requiring multiple passes of the probe 28 and fingers 30 relative to the solar module 10. The exemplary embodiment shown in FIG. 2 includes three different positions along the length dimension L at which the fingers 30 are to establish communication with the exposed contact 14 of the photovoltaic cells 12 to receive the electrical output signal of the photovoltaic cells 12, but any desired number of positions 32 can be selected.

A switch unit 34 is operatively coupled between a measurement circuit 36 and the probe 28 to selectively coupling the plurality of test fingers 30 to the measurement circuit 36 for transmitting the electrical output signal from the test fingers 30 to the measurement circuit 30. The measurement circuit 36 can be any electric circuit that can quantify one or more properties of the electric output signal introduced to the test system 26 via the fingers 30. In the embodiment of FIG. 2, the measurement circuit 36 is a multimeter for measuring the open-circuit voltage across each photovoltaic cell 12, but the multimeter could, according to alternate embodiments, measure at least one of: the current through the photovoltaic cells 12, the overall open-circuit voltage of the solar module 10, and any other property that can be compared to a desired value of that quantity to indicate whether the solar module 10 is converting light energy into electric energy as desired.

The measurement circuit 36 can measure and assign a value to the property for the electric output signal introduced to each test finger 30 and generate a measured value signal representing each such value to be transmitted to a control unit 38. The control unit 38 can be a microprocessor-based computer terminal that parses computer-executable instructions stored in an electronic memory device, for example, in communication with the control unit 38. The computer-executable instructions define steps to be initiated by the control unit 38 for storing, at least temporarily, the measured value signals representing the measured property of the electric output signal, which in turn indicate the presence and location of a defective region of the photovoltaic cells 12, and controlling operation of the test system 26 as described herein.

The control unit 38 can evaluate the received measured value signals generated by the measurement unit 36 and determine whether a tested region of the photovoltaic cells 12 is defective based at least in part on the measured value signals. For instance, the measurement unit 36 can generate a measured value signal having a magnitude that is proportional to the value of the open-circuit voltage at one of the tested regions of the photovoltaic cells 12. The magnitude of the measured value signal can be compared by the control unit 38 to a predetermined, minimum value above which the measured value signal represents the open-circuit voltage of a properly functioning region of the photovoltaic cells 12. If the comparison performed by the control unit 38 reveals that the magnitude of the measured value signal falls below the predetermined minimum value then the control unit 38 can determine that the measured open-circuit voltage did not meet the minimum voltage required of properly functioning regions of the photovoltaic cells 12, and indicate as much.

A driver 46, such as an electric motor or other suitable actuator can also be provided to move at least one of the probe 28 and the solar module 10 to position the probe 28 and test fingers 30 at a plurality of test positions 32 along the second dimension of the solar module 10. The driver can optionally cooperate with a track (not shown) to adjust the position of the probe 28 over a portion of the solar module 10 along the second dimension, stopping occasionally to establish contact between the test fingers 30 and the positions 32 along the exposed contacts 14 of the photovoltaic cells 12. The test system 26 can perform the test measurements at the plurality of test positions 32 along the photovoltaic cells 12 each time contact is established. Other embodiments of the invention include a driver 46 that moves the solar module 10 while the probe 28 is held stationary. The control unit 38 is operatively coupled to communicate to control operation of the driver 46 for moving at least one of the probe 28 and the solar module 10 to establish contact between the fingers 30 and the exposed contacts 14 along the length L of the photovoltaic cells 12 forming the solar module 10. As shown in FIG. 2, the communication channel 48 between the control unit 38 and the driver 46 includes a pair of antennas 50, forming a wireless communication channel 48, but any suitable communication channel such as a wired connection is within the scope of the invention.

The control unit 38 can also include a display device 40 for generating a visible display that can be observed by an operator to indicate the presence and location of one or more defective regions of the photovoltaic cells 12 on the solar module 10. The display device 40 can be a conventional computer monitor, for example, and/or a printer, plotter or other such device that generates a visible, and optionally a hardcopy output of the information indicative of one or more defective regions on the photovoltaic cells 12 and their locations.

FIG. 3 shows a cross section of the solar module 10 disposed between the probe 28 including the test fingers 30 and one or more light sources 42. The solar module 10 is illuminated with light energy 44 emitted by the light sources 42 to be converted by the photovoltaic cells 12 into the electrical output signal during testing. The light sources 42 can be a single lamp, an array of lamps, a solid state or organic light emitting device, or any other suitable light source that provides a homogenous light intensity and a suitable spectrum of wavelengths to the entire collection of photovoltaic cells 12 provided to the solar module 10. According to alternate embodiments, the light source 42 can emit variable-intensity light energy 44. A test finger 30 corresponding to each photovoltaic cell 12a, 12b, 12c . . . 12* is provided to the probe 28 for substantially simultaneously communicating with the exposed contact 14 of each photovoltaic cell 12. The test fingers 30 are arranged along the width dimension W to span substantially entirely across the width dimension W of the solar module 10. During testing the light energy 44 is imparted onto the photovoltaic cells 12 to be converted into electric energy. While the photovoltaic cells 12 are illuminated the test fingers 30 are brought into contact with the exposed contact 14 of the photovoltaic cells 12 at the different positions 32 along the length dimension L of the solar module 10 along which the photovoltaic cells 12 extend.

In use, the test system 26 can be employed as part of the process for assembling thin film solar modules 10 to test for malfunctioning solar modules 10 before they are delivered to end users. An embodiment of a test method of testing a thin film solar module 10 according to an embodiment of the invention is shown in the flow diagram of FIG. 4. The solar module 10 to be tested includes a plurality of adjacent photovoltaic cells 12 distributed along a first dimension W of the solar module 10 and extending along a second dimension L of the solar module 10 as described above, and an electrical output signal is to be tested for variations along the second dimension of the solar module 10.

The position of the probe 28 and test fingers 30 is adjusted by the driver 46 to an initial test position 32 along the length L of the photovoltaic cells 12 and contact between each of the fingers 30 and the exposed contacts of the photovoltaic cells 12 is established at step 100. Optionally, this contact between the fingers 30 and the corresponding exposed contacts 14 of the photovoltaic cells 12 can occur substantially simultaneously such that all the test fingers 30 make contact with the exposed contacts 14 as a batch, or sequentially such that contact between the test fingers 30 and exposed contacts 14 occurs sequentially. At least a portion of one or more photovoltaic cells 12 forming the solar module 10 is illuminated at step 110 by light energy 44 from the one or more light sources 42.

An electric output signal including the electric energy generated and emitted by each of the at least one of the photovoltaic cells 12 at the initial test position 32 along the second dimension while being illuminated is received by the test system 26 via the fingers 30 at step 120. The test fingers 30 through which the electric energy emitted by the photovoltaic cells 12 is to be introduced to the remainder of the test system 26 can be individually selected by the switch unit 34. Each test finger 30 can be selected sequentially one at a time, or in any desired order and number desired. As each test finger 30 is selected by the switch unit 34, the output signal introduced to the that test finger 30 (or a representation of the signal) is communicated to the measurement circuit 36 at step 130, and an electrical property such as the open-circuit voltage of the output signal measured.

The measured electrical property can be represented by a measured value signal generated by the measurement circuit 36, and the measured value signal transmitted to the control unit 38 at step 140. The control unit 38 can store a quantity represented by the measured value signal in a computer-accessible memory, at least temporarily, and evaluate the measured value signal. The measured value signal can be compared to a predetermined threshold value that differentiates a suitable measured value signal from a measured value signal representing a measured electrical property indicative of a defective region of the photovoltaic cells 12.

The comparison can be performed internally, behind the scenes by the control unit 38, which can then indicate the presence of any defective regions based on the comparison. According to other embodiments, the control unit 38 can leave the actual comparison up to an operator, instead indicating the measured value signal without first performing the comparison. For such embodiments, the control unit 38 can display a visible presentation of the measured value signal at the current test position 32, and optionally all the test positions 32 along the length L of one or more of the photovoltaic cells 12 as discussed below with reference to FIG. 5 to allow the operator to readily determine the existence of a defective region of the photovoltaic cells 12, and the location of any such defective regions.

Following the receipt of the electrical output of each of the photovoltaic cells 12 via the test fingers 30 at the initial position 32, the control unit 38 determines whether the fingers 30 have received the electric output signal at all desired test positions 32 along the length L of the photovoltaic cells 12 forming the solar module 10 at step 150. If the electric output signal has not been received by the fingers 30 at each desired test position 32 along the length of the photovoltaic cells 12 forming the solar module 10, then at least one of the probe 28 and the solar module 10 is moved to a different position 32 by operation of the driver 46 under the control of the control unit 38 at step 160 and the process repeated.

If, at step 150 it is determined that the electrical output of each of the photovoltaic cells 12 has been introduced to the test system 26 via the test fingers 30 at all desired test positions 32 along the length L of the photovoltaic cells 12, then the control unit 38 indicates at step 170 whether there are any defective regions along the photovoltaic cells 12. The indication also provides the operator with a location of any such defective regions on the solar module 10. This indication is the result of the evaluation of the measured value signal transmitted to the control unit 38 to represent the open-circuit voltage at the different test positions 32 along the length L of each of the photovoltaic cells 12, effectively "mapping" the performance of the photovoltaic cells 12 over the entire surface of the solar module 10.

Figure 5:
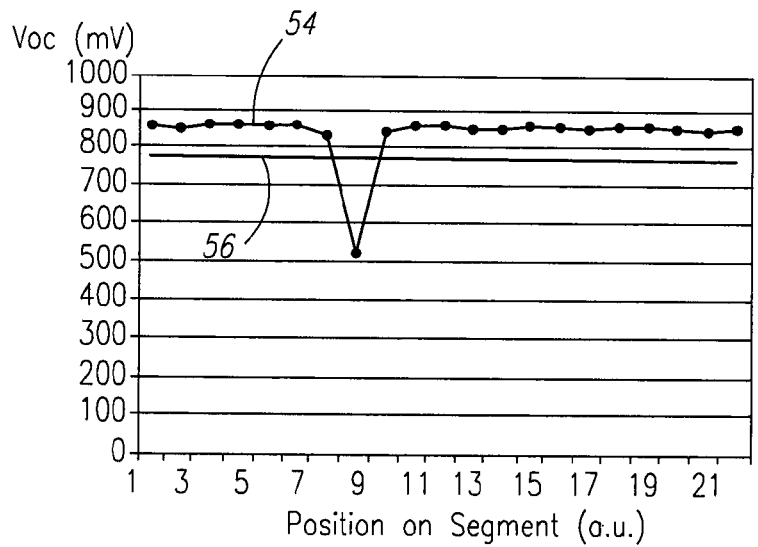
FIG. 5 is an example of a graphical indication of a defective region of a photovoltaic cell generated by a control unit according to an aspect of the present invention.

The indication of any defective regions of the photovoltaic cells 12 can be graphical in nature, such as the plot shown in FIG. 5. As mentioned above, a comparison of the measured value signal representing the open-circuit voltage or other electrical property at each test position 32 along the length L of each photovoltaic cell 12 can be performed by the control unit 38. The plot shown in FIG. 5 illustrates the open circuit voltage at 21 test positions 32 along the length L of an individual photovoltaic cell 12 provided to the solar module 10 under test. As can be seen, the open-circuit voltage values can be connected to form a line 52 on the same plot as a line 54 representing the minimum open-circuit voltage expected to be generated by the various regions of the photovoltaic cell 12 for the particular illumination of the photovoltaic cell 12 during the test. From this graphical indication generated by the control unit 38 it can be determined that a region of the photovoltaic cell 12 corresponding to test position 23 number nine (9) is defective, since open circuit voltage generated at that region falls below the minimum voltage line 56. A separate graphical indication can be produced by the control unit 38 for each photovoltaic cell 12 of the solar module 10, and/or a common graphical indication can combine the data for all photovoltaic cells 12.

Figure 6:
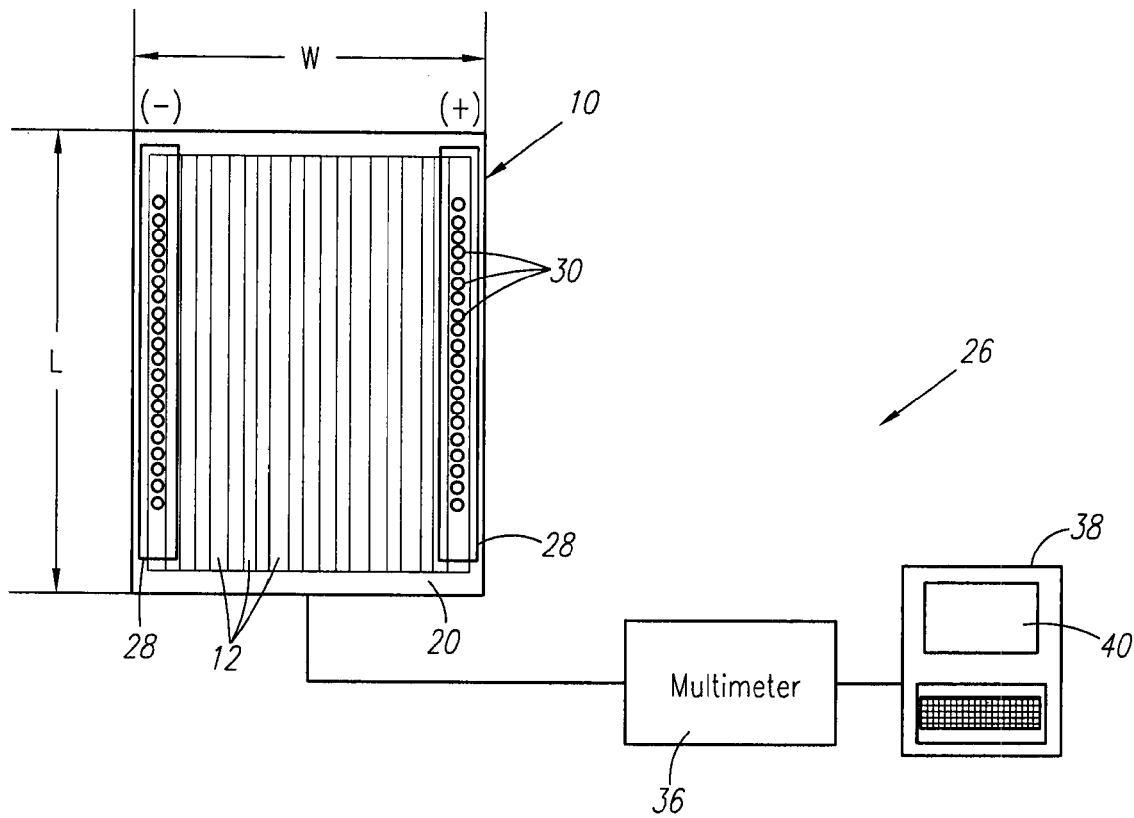
FIG. 6 is a schematic representation of a test system for identifying a malfunctioning portion of a thin-film solar module according to an aspect of the present invention.

FIG. 6 illustrates an alternate embodiment of the present invention. As shown, the solar module 10 again includes photovoltaic cells 12 distributed along a width dimension W and extending longitudinally along the length dimension L. A plurality of probes 28, each including a plurality of the test fingers 30 extending there from are positioned adjacent to the outermost photovoltaic cells 12 of the solar module 10. One of the outermost photovoltaic cells 12 is a reference, or negative terminal (−) of the solar module 10 and the other outermost photovoltaic cell 12 is the positive terminal (+) of the solar module 10. The open-circuit voltage across the two outermost photovoltaic cells 12 (i.e., the positive and negative terminals) of the solar module 10 is the cumulative open-circuit voltage of all individual photovoltaic cells 12 combined since the photovoltaic cells 12 are connected in series.

Each of the test fingers 30 provided to a common probe 28 can substantially simultaneously make contact with different test positions 32 of the exposed electrical contact 14 along the length dimension L of the solar module 10. The electrical signal introduced to the test system 26 at each of the test positions 32 located along the length dimension L of a common photovoltaic cell 12 can be introduced to the test fingers 30 substantially simultaneously or sequentially without moving the probe 28. The open circuit voltage across the two outermost photovoltaic cells 12, which is the overall open circuit voltage of the solar module 10, can be introduced to the test system 26 at each of the different test positions 32 along the length dimension L of the photovoltaic cells 12 without moving the probe 28 once initially positioned for testing.

Just as for previous embodiments, the light source 42 can illuminate the solar module 10 to cause the photovoltaic cells 12 to generate and electric energy in response. While the test fingers 30 of each probe 28 are in contact with the plurality of different test positions 32 along the length dimension L of their respective photovoltaic cell 12, the open-circuit voltage or other electrical property across corresponding pairs of opposing test fingers 30 can be evaluated by the measurement circuit 36. The control unit 38 can, based on the measured electrical property, evaluate any open circuit voltage variations along the length dimension L of the solar module 10. Likewise, a graphical indication such as that shown in FIG. 5 can be generated by the control unit 38, indicating whether any of the open circuit voltages or other electrical property tested along the length L of the photovoltaic cells 12 at the plurality of different test positions 32 are defective. Such a graphical indication can include a plot of open circuit voltage in millivolts versus position along the length of the photovoltaic cells 12, for example. An additional visual indicator such as the line 56 in FIG. 5 indicating a minimum threshold voltage below which a tested region is considered defective can also be included.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention.

What is claimed is:

1. A test system for identifying a defective region of a photovoltaic cell from among a plurality of photovoltaic cells collectively forming a thin film solar module, the test system comprising:
    a probe comprising a plurality of test fingers that are arranged to each be substantially simultaneously placed adjacent to an electric contact provided to different regions of one or more of the plurality of photovoltaic cells, wherein
        each of the test fingers is to receive an electrical output from the different regions of the one or more photovoltaic cells;
    a light source that emits light to be converted by the photovoltaic cells into the electrical output during testing;
    a measurement circuit that measures a property of the electrical output received from the different regions of the photovoltaic cells and transmits a measured value signal indicative of the property measured by the measurement circuit; and
    a control unit operatively coupled to the measurement circuit for receiving the measured value signal and generating a visible display indicating that at least one of the different regions of the solar module is a defective region based at least in part on the measured value signal and indicating a location of the defective region on the solar module.

2. The test system according to claim 1, further comprising a display unit for graphically presenting a schematic image of the solar module and graphically identifying a location of the defective region on the solar module.

3. The test system according to claim 2, wherein the display unit displays a graphical representation of the electrical output for the different regions relative to a location of the different regions.

4. The test system according to claim 1, wherein the plurality of test fingers are each arranged to be substantially simultaneously placed adjacent to an electric contact provided to different regions of a common photovoltaic cell.

5. The test system according to claim 1, wherein the plurality of test fingers are each arranged to be substantially simultaneously placed adjacent to an electric contact provided to a region of different photovoltaic cells of the solar module.

6. The test system according to claim 5, further comprising a transport device that adjusts a position of at least one of the probe and the solar module to substantially simultaneously locate the test fingers adjacent to electrical contacts provided at a plurality of different regions located along the plurality of respective photovoltaic cells.

7. The test system according to claim 1, further comprising a switching unit operatively coupled to the probe for selectively communicating the electrical output from each of the fingers to the measuring circuit.

8. The test system according to claim 7, wherein the switching unit sequentially communicates the electrical output from a single finger at a time to the measuring circuit.

9. The test system according to claim 1, wherein the light source is a variable light source for varying an intensity of the light to be converted by the photovoltaic cells into the electrical output during testing.

10. The test system according to claim 1, wherein the electrical output signal is an individual open-circuit voltage of the one or more photoelectric cells.

11. A method of testing a thin film solar module comprising a plurality of adjacent photovoltaic cells distributed along a first dimension of the solar module and extending along a second dimension of the solar module, wherein an electrical output is to be tested for variations along the second dimension of the solar module, the method comprising:
illuminating at least one photovoltaic cell of the solar module;
receiving an electrical output of the at least one photovoltaic cell at a first position along the second dimension of the solar module;
receiving an electrical output of the at least one photovoltaic cell at a second position along the second dimension of the solar module, wherein the second position is different than the first position;
performing a comparison of the electrical output from the photovoltaic cell at the first and second positions along the second dimension to predetermined values to determine if the electrical output from the photovoltaic cell at the first and second positions is at least equal to the predetermined values;
determining that at least one of the first and second positions of the photovoltaic cell along the second dimension of the solar module is a defective region of the solar module if the electrical output from the photovoltaic cell at the at least one of the first and second positions does not at least equal the predetermined values; and
indicating a location of the defective region relative to another region of the solar module.

12. The method according to claim 11, wherein receiving the electrical output of the photovoltaic cell at the first and second positions along the second dimension of the solar module comprises:
establishing communication between an electrical contact of the photovoltaic cell at the first position and a first of a plurality of test fingers extending from a probe;
adjusting a position of at least one of the probe and the solar module to locate the probe adjacent to the second position along the second dimension; and
establishing communication between an electrical contact of the photovoltaic cell at the second position and the first test finger extending from the probe.

13. The method according to claim 12, further comprising:
establishing communication between an electrical contact of an adjacent photovoltaic cell of the solar module and a second of the plurality of test fingers extending from the probe.

14. The method according to claim 11, wherein receiving the electrical output of the photovoltaic cell at the first and second positions along the second dimension of the solar module comprises:
locating a probe comprising a plurality of test fingers adjacent to the solar module, wherein
a first test finger extending from the probe is placed adjacent to an electrical contact provided to the photovoltaic cell at the first position, and
a second test finger extending from the probe is placed adjacent to another electrical contact provided to the photovoltaic cell at the second position;
establishing communication between the first test finger and the electrical contact; and
establishing communication between the second test finger and the another electrical contact.

15. A test system for identifying a malfunctioning portion of a solar module, the system comprising:
a probe comprising a plurality of test fingers each arranged to communicate with a different one of a plurality of adjacent photovoltaic cells arranged along a first dimension of the solar module for receiving an electrical output from each of the plurality of photovoltaic cells, wherein
the plurality of test fingers are arranged to extend substantially entirely across the solar module in the first dimension during testing;
a light source that emits light to be converted by the photovoltaic cells into the electrical output during testing;
a driver that adjusts a position of at least one of the probe and the solar module to position the probe at a plurality of test locations along a second dimension of the solar module; and
a measurement circuit that evaluates the electrical output from the plurality of photovoltaic cells introduced to the test fingers during testing and generates a value representing a contribution of each of the photovoltaic cells tested to an overall output of the solar module.

16. The test system according to claim 15, further comprising:
a switching unit for sequentially selecting each of the plurality of test fingers in an order in which the electrical output received by each of the test fingers is to be communicated to the measurement circuit.

17. The test system according to claim 16, wherein the switching unit selects a single test finger at a time.

18. The test system according to claim 15, wherein the measurement circuit measures an open-circuit voltage of each of the photovoltaic cells tested.

19. The test system according to claim 15, further comprising a comparator that performs a comparison of the value representing the contribution of each of the photovoltaic cells tested to a predetermined value and indicates a malfunctioning photovoltaic cell based at least in part on the comparison.

20. The test system according to claim 15, wherein the test fingers are arranged to extend substantially entirely across a width of the solar module, and the driver adjusts the position of the probe along a length of the solar module to test the photovoltaic cells provided to the solar module.

21. The test system according to claim 20, further comprising a comparator that performs a comparison of the value representing the contribution of each of the photovoltaic cells tested to a predetermined value, indicates a malfunctioning photovoltaic cell based at least in part on the comparison, and indicates a location of the malfunctioning photovoltaic cell on the solar module.

22. The test system according to claim 21, wherein the comparator indicates the location of the malfunctioning photovoltaic cell as a graphical representation of electrical output versus location on the solar module.

* * * * *